(12) United States Patent (10) Patent No.: US 7,733,680 B2
Im (45) Date of Patent: Jun. 8, 2010

(54) NON-VOLATILE MEMORY MODULE FOR PREVENTING SYSTEM FAILURE AND SYSTEM INCLUDING THE SAME

(75) Inventor: Jeon-Taek Im, Anseong-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 165 days.

(21) Appl. No.: 11/962,435

(22) Filed: Dec. 21, 2007

(65) Prior Publication Data

US 2008/0158956 A1 Jul. 3, 2008

(30) Foreign Application Priority Data

Dec. 29, 2006 (KR) ............. 10-2006-0138672

(51) Int. Cl.
*G11C 5/02* (2006.01)
(52) U.S. Cl. .............. 365/51; 365/52; 439/65; 711/115
(58) Field of Classification Search .......... 365/51, 365/52, 63, 230.03; 711/115, 100, 168; 439/65
See application file for complete search history.

(56) References Cited

U.S. PATENT DOCUMENTS

| | | | | |
|---|---|---|---|---|
| 6,137,709 | A * | 10/2000 | Boaz et al. | 365/51 |
| 6,172,895 | B1 * | 1/2001 | Brown et al. | 365/63 |
| 6,654,270 | B2 * | 11/2003 | Osaka et al. | 365/51 |
| 6,930,904 | B2 * | 8/2005 | Wu | 365/72 |
| 6,996,648 | B2 | 2/2006 | Vu | |
| 7,539,035 | B2 * | 5/2009 | Lee et al. | 365/63 |
| 2004/0143773 | A1 * | 7/2004 | Chen | 713/400 |
| 2005/0170673 | A1 * | 8/2005 | Choi | 439/65 |
| 2006/0236031 | A1 * | 10/2006 | Perego et al. | 711/115 |

FOREIGN PATENT DOCUMENTS

| | | |
|---|---|---|
| JP | 20010117815 | 4/2001 |
| JP | 2004-213682 | 7/2004 |
| KR | 10-0281432 | 7/1997 |
| KR | 1020060072213 A | 6/2006 |

OTHER PUBLICATIONS

Korean Office Action dated Jun. 27, 2008 in corresponding Korean Patent Application No. 10-2006-0138672.

* cited by examiner

*Primary Examiner*—Tuan T Nguyen
*Assistant Examiner*—Toan Le
(74) *Attorney, Agent, or Firm*—F.Chau & Associates, LLC

(57) ABSTRACT

A non-volatile memory module for preventing system failure and a system including the same, in which the non-volatile memory system includes a first socket and a second socket each having a notch coupler, a first memory module, a memory controller configured to control the first memory module, and a printed circuit board on which the memory controller and the first and second sockets are installed and electrical signal lines are formed between the memory controller and the first and second sockets. The first memory includes a plurality of non-volatile memory devices and stores system software. The first memory module has a structure such that it can be installed at the first socket but cannot be installed at the second socket. The non-volatile memory system may further include a second memory module for an extension of the memory capacity. The second memory module has a structure such that it can be installed at the second socket but cannot be installed at the first socket. Accordingly, system failure caused by misusage of a non-volatile memory module can be prevented.

17 Claims, 5 Drawing Sheets

NON-VOLATILE MEMORY MODULE FOR PREVENTING SYSTEM FAILURE AND SYSTEM INCLUDING THE SAME

CROSS-REFERENCE TO RELATED PATENT APPLICATION

This application claims the benefit of Korean Patent Application No. 10-2006-138672, filed on Dec. 29, 2006, in the Korean Intellectual Property Office, the disclosure of which is incorporated herein in its entirety by reference.

FIELD OF THE INVENTION

The present disclosure relates to a memory module and a system including the same and, more particularly, to a non-volatile memory module for preventing system failure and a system including the same.

BACKGROUND OF THE INVENTION

Optical discs and hard disc drives (HDDs) have usually been used as large-capacity storage media. Recently, however, with the development of semiconductor technology, research and development for replacing an HDD with a non-volatile memory module have been performed. More specifically, NAND flash memory is being considered as a memory that can replace an HDD because it has a high degree of integration and has a low cost with respect to its capacity.

When a NAND flash memory module is used in a storage system, the storage system uses a plurality of NAND flash memory modules. At this time, a system maker or provider usually stores system software (S/W), such as an operating system (OS) and critical application programs, that is essential to system operation in one of the plurality of flash memory modules when manufacturing the storage system. The memory modules other than the memory module storing the system S/W are used to extend the memory capacity of the system. Because the form factors of all memory modules are the same, however, it is highly likely for users to erroneously move the memory module that stores the system S/W or to misuse it.

FIG. 1 is a schematic diagram illustrating a conventional NAND flash memory module system 100. The conventional NAND flash memory module system 100 includes a memory controller 110, a plurality of memory modules 121, 122, 123, and 124, and a plurality of sockets 131, 132, 133, and 134. Each of the memory modules 121 through 124 includes a plurality of NAND flash memory chips MC, each of which is connected with the memory controller 110 via a signal line 140 connecting the sockets 131 through 134 with the memory controller 110. There may be more or less memory modules than the four that are shown.

Typically, the form factors of the four memory modules 121 through 124 are the same. The conventional memory modules 121 through 124 usually include one or more notches in order to prevent the user from misinserting a module. These notches are made in the same standard (for example, they have the same size and the same shape) in all of the memory modules 121 through 124. A notch fits with only a corresponding notch coupler and may be referred to as a physical or mechanical key for preventing misinsertion. The sockets 131 through 134 are also all the same. In other words, the sockets 131 through 134 have the same form factors and have the notch couplers following the same standard.

Users can purchase and use additional NAND flash memory modules in order to extend the memory storage capacity. In this case, there is a possibility that a memory module is not inserted into a proper socket since the form factors of all sockets are the same. In addition, no alarm or warning is given when a user removes a memory module storing the system S/W from the proper socket in the conventional technology and, therefore, the memory module storing the system S/W may be lost or inserted into a wrong socket.

In addition, according to the conventional technology, a separate NOR flash memory for storing a boot code or a boot loader for system booting is installed on a system mother board or a NAND flash memory storing the boot code is used as a memory array for a memory module, which makes the system mother board complex and increases manufacturing cost.

SUMMARY OF THE INVENTION

Exemplary embodiments of the present invention provide a non-volatile memory module for preventing misusage of a memory module storing system software and system failure, and a system including the non-volatile memory module.

Exemplary embodiments of the present invention also provide a non-volatile memory module including a non-volatile memory device for storing a system boot code, thereby decreasing the complexity of a system mother board and the manufacturing cost, and a system including the non-volatile memory module.

According to exemplary embodiments of the present invention, there is provided a non-volatile memory system including a first socket and a second socket each having a notch coupler, a first memory module configured to include a plurality of non-volatile memory devices and to store system software, a memory controller configured to control the first memory module, and a printed circuit board on which the memory controller and the first and second sockets are installed and electrical signal lines are formed between the memory controller and the first and second sockets. The first memory module can be installed at the first socket but cannot be installed at the second socket.

The non-volatile memory system may further include a second memory module configured to include a plurality of non-volatile memory devices and to extend memory capacity. The second memory module can be installed at the second socket but cannot be installed at the first socket.

At least one notch may be formed in each of the first and second memory modules and at least one notch coupler may be formed in each of the first and second sockets. The notch in the first memory module may be different from the notch in the second memory module, and the notch coupler in the first socket may be different from the notch coupler in the second socket.

At least one memory device from among the plurality of non-volatile memory devices included in the first memory module may be used to store a system boot code. The first memory module may further include a plurality of pins. At least one pin from among the plurality of pins may be exclusively used for an interface between the non-volatile memory device used to store the system boot code and the memory controller.

The non-volatile memory system may further include an alarm unit configured to generate an alarm sound when the first memory module is removed from the first socket.

According to exemplary embodiments of the present invention, there is provided a non-volatile memory module including a memory module substrate in which at least one notch and a plurality of input/output pins are formed, a first non-volatile memory device installed on at least one side of the memory module substrate to store a system boot code, and a second non-volatile memory device storing system software.

The non-volatile memory module can be installed at a socket, for a non-volatile memory module storing the system software, which includes a notch coupler that can be engaged with the at least one notch, but the non-volatile memory module cannot be installed at a socket, for a non-volatile memory module for capacity extension, which includes a notch different from the at least one notch.

BRIEF DESCRIPTION OF THE DRAWINGS

Exemplary embodiments of the present invention will be understood in more detail from the following descriptions taken in conjunction with the attached drawings, in which.

DETAILED DESCRIPTION OF EXEMPLARY EMBODIMENTS

Exemplary embodiments of the present invention now will be described more fully hereinafter with reference to the accompanying drawings, in which exemplary embodiments of the present invention are shown. This invention may, however, be embodied in many different forms and should not be construed as limited to the exemplary embodiments set forth herein. Rather, these exemplary embodiments are provided so that this disclosure will be thorough and complete, and will fully convey the scope of the invention to those of ordinary skill in the art. Like numbers refer to like elements throughout.

Figure 1:
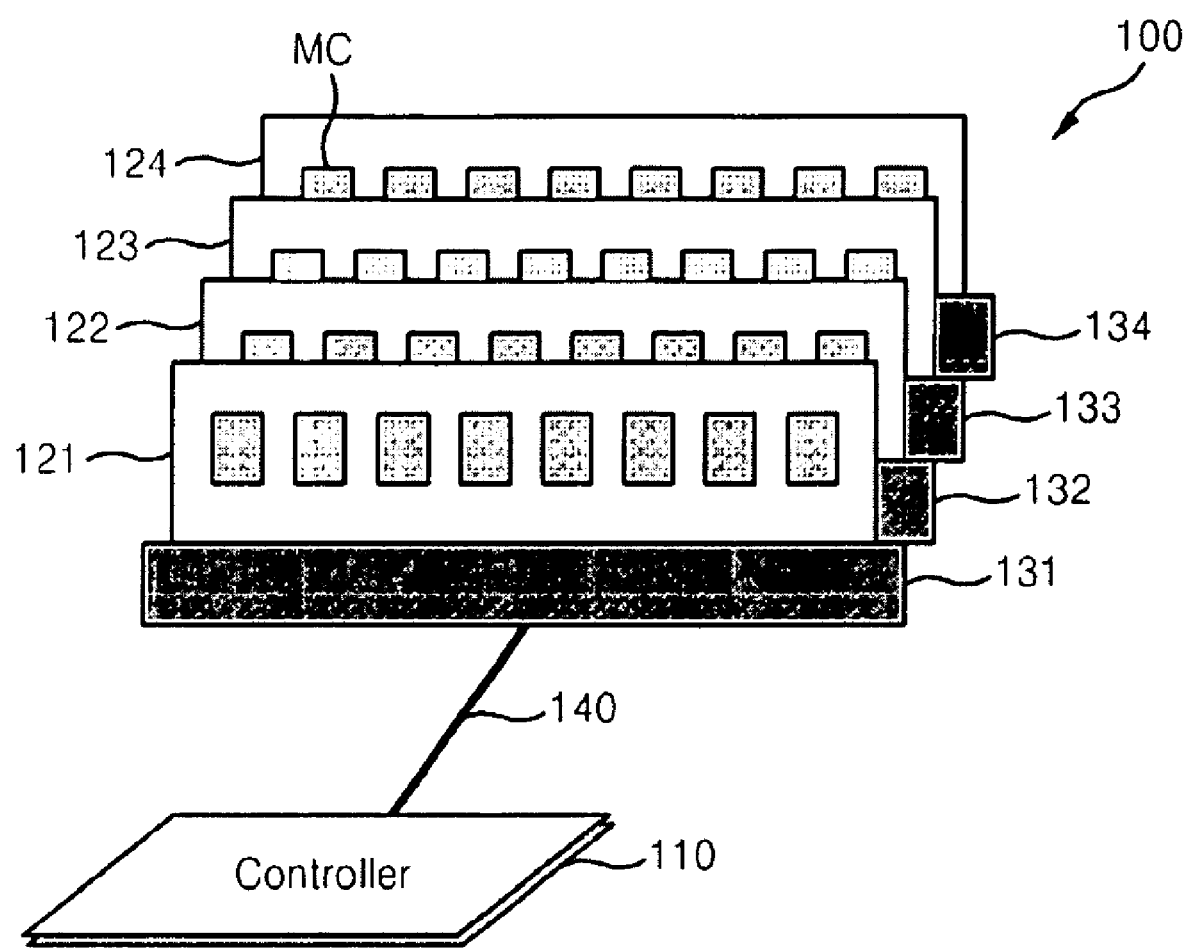
FIG. 1 is a schematic diagram illustrating a conventional NAND flash memory module system.
Figure 2:
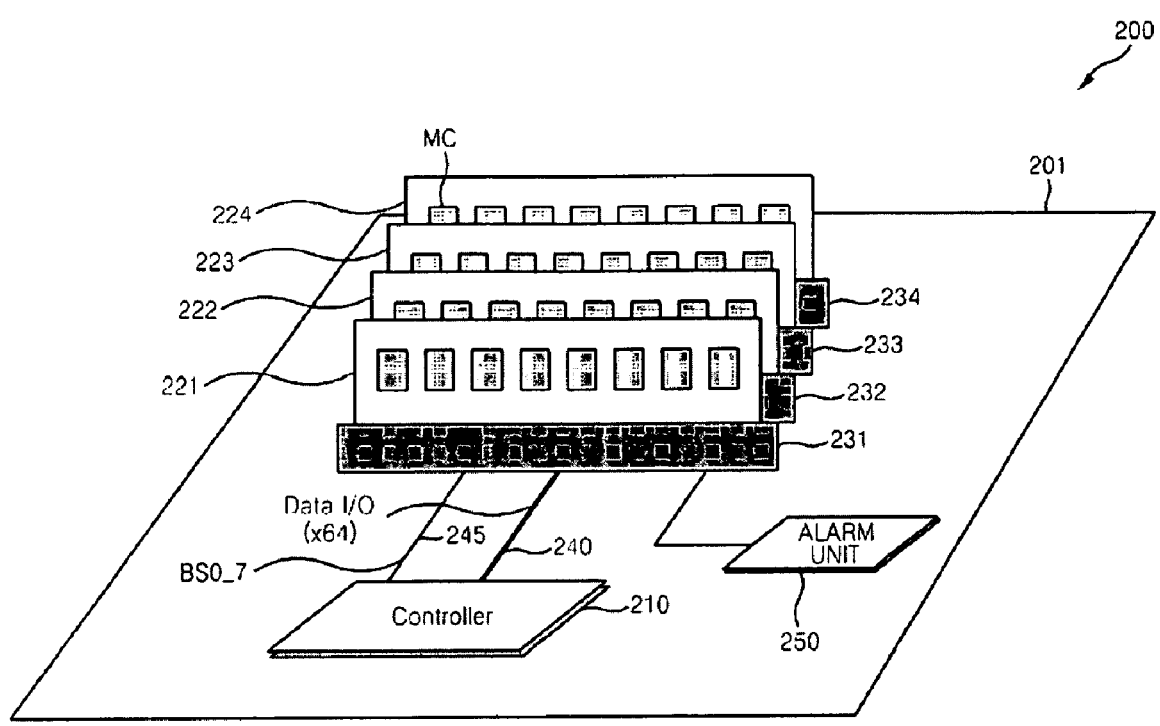
FIG. 2 is a schematic diagram illustrating a non-volatile memory system according 2 to an exemplary embodiment of the present invention.
Figure 3:
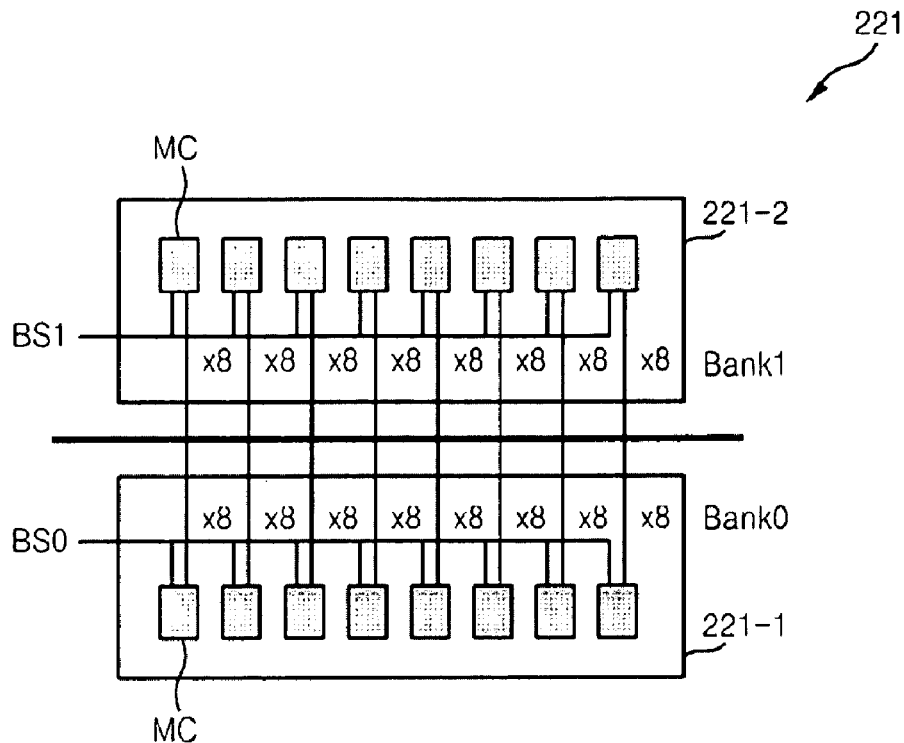
FIG. 3 illustrates a non-volatile memory module according to an exemplary embodiment of the present invention.

FIG. 2 is a schematic diagram illustrating a non-volatile memory system 200 according to an exemplary embodiment of the present invention, and FIG. 3 illustrates a non-volatile memory module according to an exemplary embodiment of the present invention.

According to exemplary embodiments of the present invention, the non-volatile memory system 200 includes a memory controller 210, a plurality of, for example, four, memory modules 221, 222, 223, and 224, a plurality of, for example, four, sockets 231, 232, 233, and 234, and an alarm unit 250. The memory controller 210, the sockets 231 through 234, and the alarm unit 250 are installed on a printed circuit board (PCB) 201. When the non-volatile memory system 200 is used as a computer storage medium, the PCB 201 may be a mother board.

On the PCB 201, data signal lines, for example a 64-bit data bus, 240 electrically connecting the controller 210 with the sockets 231 through 234 and bank selection signal lines 245 are wired. The memory modules 221 through 224 are installed at the corresponding sockets 231 through 234, respectively, so that they transmit and receive data and control signals to and from the controller 210 via the sockets 231 through 234.

Referring to FIG. 3, eight NAND flash memory chips MC each having 8-bit data input/output (I/O) lines may be installed on each side of a substrate of the memory module 221. The eight memory chips MC installed on one side of the memory module 221 may form a single memory bank BANK0 221-1 and the eight memory chips MC installed on the other side of the memory module 221 may form another memory bank BANK1 221-2. In other words, two groups of eight memory chips MC are installed on the front and rear sides of the memory module 221 and form two memory banks 221-1 and 221-2, and two bank selection signals BS0 and BS1 are input to the memory module 221. Each of the bank selection signals BS0 and BS1 is input to the memory chips MC included in a corresponding one of the memory banks 221-1 and 221-2. In this exemplary embodiment, the first bank selection signal BS0 is input to the memory chips MC included in the first memory bank 221-1, and the second bank selection signal BS1 is input to the memory chips MC included in the second memory bank 221-2.

During system operation, the memory chips MC included in the same memory bank may be selected one at a time. Accordingly, a bank selection signal line 245 is wired on each side of the memory module 221 so that the eight memory chips MC included in the same memory bank 221-1 or 221-2 can be selected at a time during the system operation. In addition, the 64-bit data bus 240 is wired in order to input and output data. Accordingly, two bank selection signal lines 245 are connected to the single memory module 221 and the 8-bit data I/O lines respectively connected with the eight memory chips MC are connected with the 64-bit data bus 240 in common. Although not shown, additional signal lines may also exist. The number of memory banks for each memory module is not limited to the number shown.

The controller 210 may output eight bank selection signals BS0 through BS7 via the bank selection signal lines 245 and the bank selection signals BS0 through BS7 may be input from the least significant signal BS0 to the most significant signal BS7 to the first through fourth sockets 231 through 234 sequentially. For instance, the first and second bank selection signals BS0 and BS1 corresponding to the least significant signals among the bank selection signals BS0 through BS7 are input to the first socket 231. The next third and fourth bank selection signals BS2 and BS3 are input to the second socket 232. The next fifth and sixth bank selection signals BS4 and BS5 are input to the third socket 233. The most significant signals, that is, the seventh and eighth bank selection signals BS6 and BS7 are input to the fourth socket 234.

A module storing system software (S/W), including an operating system and application programs, which is referred to as a first memory module 221, may be installed by a system maker or provider at the first socket 231, to which the first and second bank selection signals BS0 and BS1 for selecting a lower region in an entire storage area that the controller 210 can support are input. The second through fourth memory modules 222, 223, and 224 used for capacity extension may be respectively installed at the second socket 232, to which the third and fourth bank selection signals BS2 and BS3 are input, the third socket 233, to which the fifth and sixth bank selection signals BS4 and BS5 are input, and the fourth socket 234, to which the seventh and eighth bank selection signals BS6 and BS7 are input. In an exemplary embodiment, the first through fourth memory modules 221 through 224 are sequentially installed at the first through fourth sockets 231 through 234, respectively. In other words, the first memory module 221 storing the system S/W may be initially installed at the first socket 231 and then the second through fourth memory modules 222 through 224 for capacity extension may be sequentially installed at the second through fourth sockets 232 through 234, respectively.

The bank selection signals BS0 through BS7 may be input to the first through fourth sockets 231 through 234 starting from the most significant signal BS7 to the least significant signal BS0. The first memory module 221 storing the system S/W is installed at the fourth socket 234 and the second through fourth memory modules 222 through 224 for capacity extension may be sequentially installed at the third through first sockets 233 through 231, respectively.

Although the single memory module 221 is illustrated in FIG. 3, the other memory modules 222 through 224 may also have the same structure as that illustrated in FIG. 3.

The first memory module 221 storing the system S/W, however, may further include a separate memory chip for storing a boot code for booting a system in addition to the memory chips MC illustrated in FIG. 3, which will be described with reference to FIG. 4.

Figure 4:
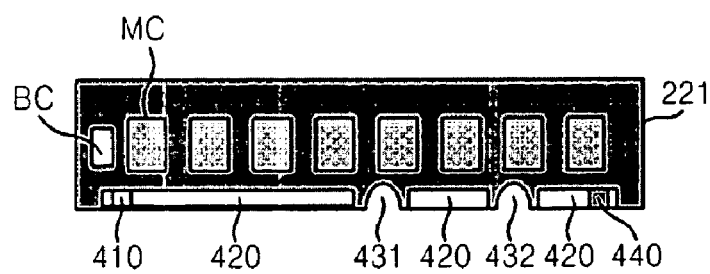
FIG. 4 illustrates a first memory module and a first socket in which the first memory module is installed according to an exemplary embodiment of the present no invention.
Figure 4:
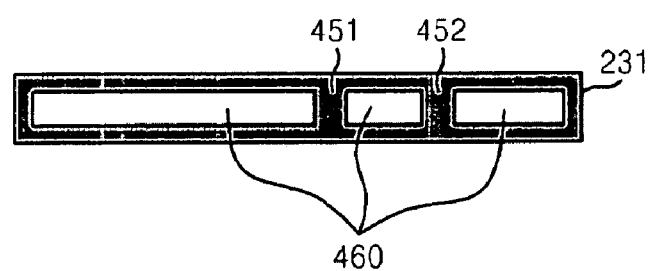
Figure 5:
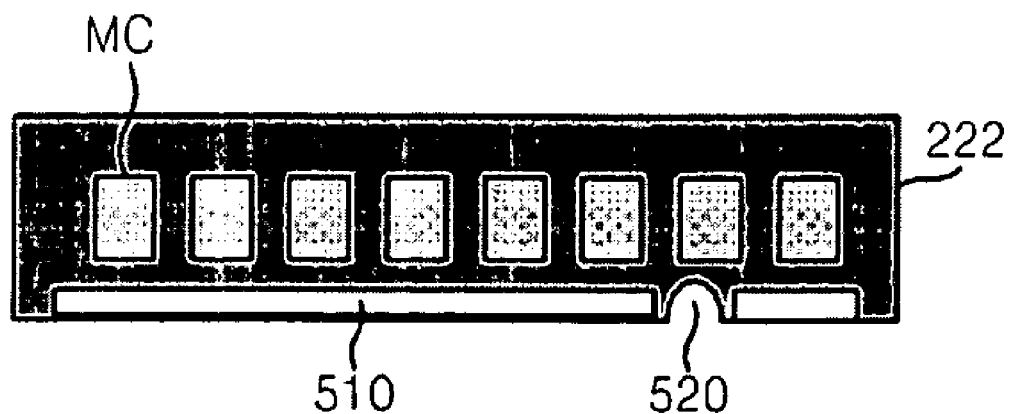
FIG. 5 illustrates a second memory module and a second socket in which the second memory module is installed according to an exemplary embodiment of the present invention.
Figure 5:
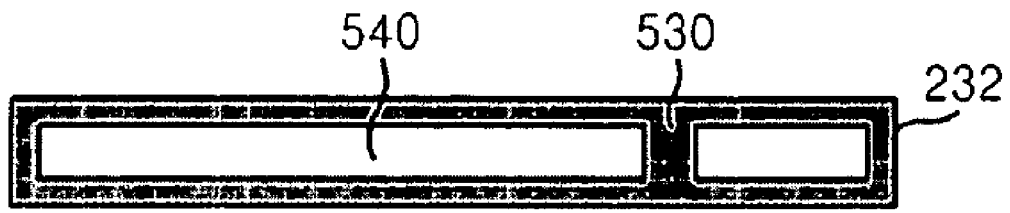

FIG. 4 illustrates the first memory module 221 and the first socket 231 in which the first memory module 221 is installed, according to an exemplary embodiment of the present invention. FIG. 5 illustrates the second memory module 222 and the second socket 232 in which the second memory module 222 is installed, according to an exemplary embodiment of the present invention.

The first memory module 221 may be a NAND flash memory module storing the system S/W, as described above. Referring to FIG. 4, the first memory module 221 may include eight memory chips MC and a small-capacity memory chip BC for storing a system boot code, which is not included in the other memory modules that are provided for capacity extension. The memory chip BC for storing the system boot code may have a smaller capacity than the other eight memory chips MC. When the memory chip BC for storing the system boot code is included in the first memory module 221 storing the system S/W, it is not necessary to install a separate chip for storing the system boot code on a mother board. Accordingly, the manufacturing cost and the size of the mother board can be reduced.

The first memory module 221 includes a plurality of pins 410, 420, and 440 and one or more notches 431 and 432. More specifically, the plurality of pins 410, 420, and 440 and the one or more notches 431 and 432 are formed in the substrate of the first memory module 221. Some pins, that is, the pins 420 of the plurality of the pins 410, 420, and 440 are used to transmit data and a control signal between the memory chips MC and the memory controller 210. At least one pin 410 from among the plurality of the pins 410, 420, and 440 may be exclusively used for an interface between the memory clip BC storing the system boot code and the memory controller 210. At least one other pin 440 from among the plurality of the pins 410, 420, and 440 may be connected with the alarm unit 250, shown in FIG. 2, which generates an alarm sound when the first memory module 221 is removed from the first socket 231.

The first socket 231 includes pin connectors 460 for connecting to the pins 410, 420, and 440 in the first memory module 221 and notch couplers 451 and 452 for being coupled to the notches 431 and 432. The positions and the sizes of the notch couplers 451 and 452 of the first socket 231 are determined so that the notch couplers 451 and 452 can be combined with the notches 431 and 432 of the first memory module 221.

The second memory module 222, shown in FIG. 5, may be a NAND flash memory module for providing a memory capacity extension, as illustrated above. Referring to FIG. 5, the second memory module 222 includes eight memory chips MC, a plurality of pins 510, and at least one notch 520. More specifically, the plurality of pins 510 and the at least one notch 520 are formed on a substrate of the second memory module 222. The second memory module 222 does not include the memory chip BC, which is included in the first memory module 221 to store the system boot code, and the pin 410, which is exclusively used for an interface between the memory chip BC and the memory controller 210. The plurality of pins 510 included in the second memory module 222 are used for transmission of data and a control signal between the memory chips MC and the memory controller 210.

The second socket 232 includes a pin connector 540 for connecting to the pins 510 in the second memory module 222 and a notch coupler 530 for being coupled to the notch 520. The positions and the sizes of the notch coupler 530 of the second socket 232 are determined so that the notch coupler 530 can be combined with the notch 520 of the second memory module 222.

Although not shown, the third and fourth memory modules 223 and 224 may have the same structure as the second memory module 222, shown in FIG. 5 and the third and fourth sockets 233 and 234 may have the same structure as the second socket 232. Accordingly, the second through fourth memory modules 222 through 224 may have the same size, for example, length, width, and thickness, and the same notch structure as one another, and the second through fourth sockets 232 through 234 also have the same size and the same notch coupler as one another.

The first memory module 221 may have the same size as the other three memory modules 222 through 224, but it has a different notch. The first socket 231 may also have the same size as the other three sockets 232 through 234, but it has a different notch coupler. As a result, the first memory module 221 cannot be installed at any one of the second through fourth sockets 232 through 234 and any one of the second through fourth memory modules 222 through 224 cannot be installed at the first socket 231.

According to an exemplary embodiment of the present invention, a memory module storing system S/W, that is, a first memory module, cannot be installed at sockets 232 through 234 provided for installation of memory modules for memory capacity extension. In addition, the memory modules 222 through 224 for memory capacity extension cannot be installed at a socket 231 provided for installation of the memory module storing the system S/W. Consequently, the memory module storing the system S/W can be prevented from being misused and being confused with memory modules provided for memory capacity extension. Accordingly, system failure caused by the misusage of a memory module can be prevented.

In exemplary embodiments of the present invention, the first memory module 221 is different from the second through fourth memory modules 222 through 224 in the number of notches. In other exemplary embodiments of the present invention, however, the first memory module 221 is different from the second through fourth memory modules 222 through 224 in the positions or size of the notches.

Figure 6:
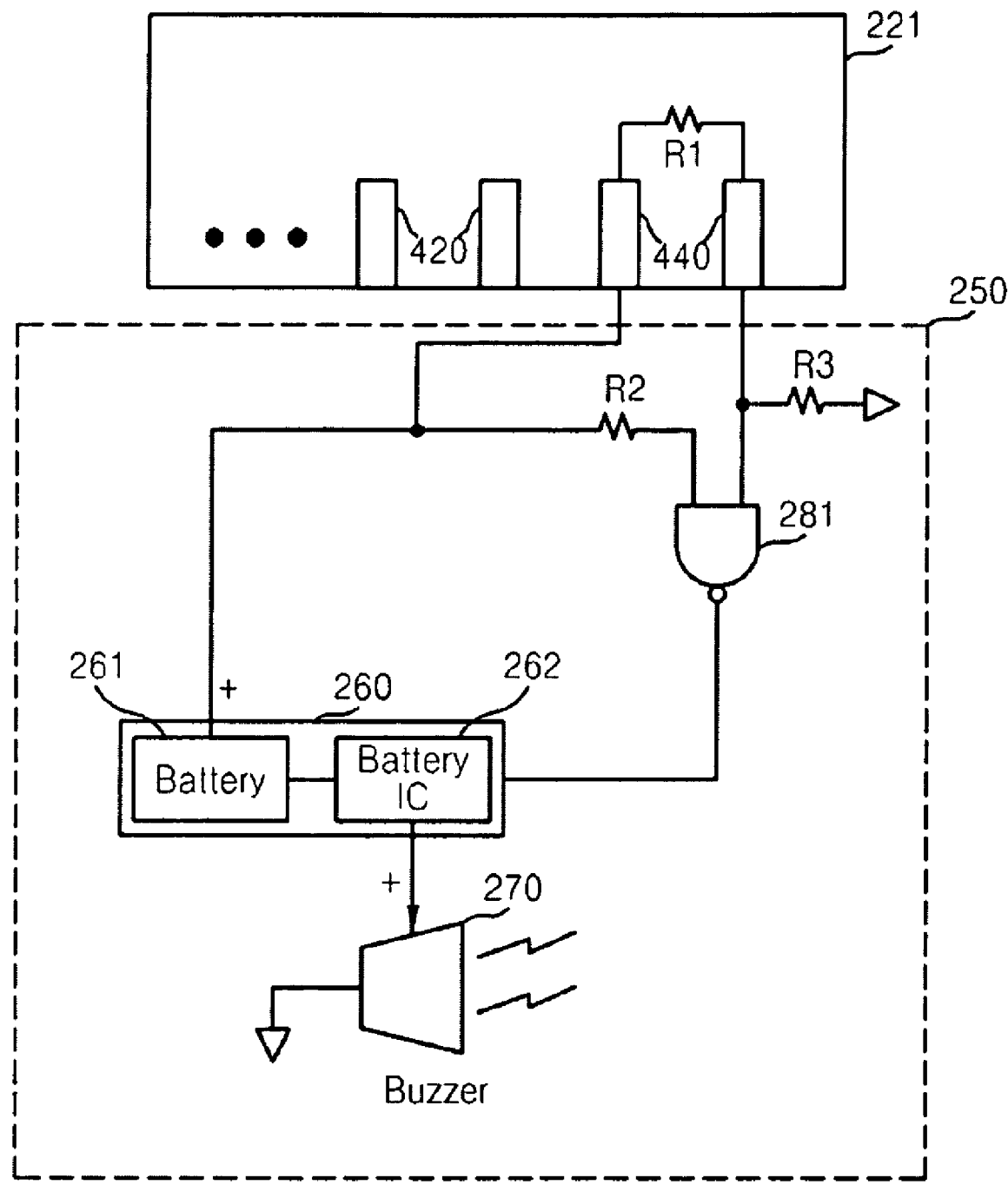
FIG. 6 is a circuit diagram of an alarm unit according to an exemplary embodiment of the present invention.

FIG. 6 is a circuit diagram of the alarm unit 250 according to an exemplary embodiment of the present invention. The alarm unit 250 is connected with first and second alarm connection pins 440 included in the first memory module 221. The first and second alarm connection pins 440 are two pins among a plurality of pins included in to the first memory module 221. The first memory module 221 includes a first resistor R1 connected between the first and second alarm connection pins 440.

The alarm unit 250 includes a battery module 260, a buzzer 270, a second resistor R2, a third resistor R3, and a NAND gate 281. The battery module 260 includes a battery 261 and a battery circuit 262. The battery 261 supplies power to the buzzer 270 even when external power or system main power is not supplied. The battery circuit 262 outputs an enable signal for enabling or disabling the buzzer 270 based on a current signal or a voltage signal, which flows in the first and second alarm connection pins 440. The buzzer 270 selectively generates an alarm sound in response to the enable signal output from the battery circuit 262.

A first input terminal of the NAND gate 281 is connected with a positive terminal of the battery 261 and the first alarm connection pin 440 via the second resistor R2. A second input terminal of the NAND gate 281 is connected with the second alarm connection pin 440 and is also connected to ground via the third resistor R3. An output signal, that is, an enable signal, of the NAND gate 281 is input to the battery circuit 262. Accordingly, the battery circuit 262 enables or disables the buzzer 270 in response to the output signal of the NAND gate 281.

When the first memory module 221 is installed at the first socket, power supplied from the battery 261 is applied to the two input terminals of the NAND gate 281, so that the output signal of the NAND gate 281 is at a first logic level, for example a low level. Accordingly, the battery circuit 262 is disabled and current is not supplied to the buzzer 270. As a result, the buzzer 270 is disabled.

When the first memory module 221 is removed from the first socket 231, power is supplied from the battery 261 to the first input terminal of the NAND gate 281, but the second input terminal of the NAND gate 281 is connected with the ground via the third resistor, so that the output signal of the NAND gate 281 is at a second logic level, for example, a high level. Accordingly, the battery circuit 262 is enabled and current is supplied to the buzzer 270. As a result, the buzzer 270 is enabled.

When the buzzer 270 is enabled, the buzzer 270 outputs an alarm sound, for example "Don't pull it out" or "Beep beep", stored in advance. Accordingly, even when the first memory module 221 is pulled out from the first socket 231 while system main power is off, the alarm sound like "Don't pull it out" or "Beep bee" is generated to prevent a user from moving the first memory module 221 from the first socket 231 to another socket.

A non-volatile memory system according to exemplary embodiments of the present invention may be installed in other systems, such as computer systems.

As described above, according to exemplary embodiments of the present invention, memory module storing system S/W can be prevented from being misused and being confused with memory modules provided for memory capacity extension. Accordingly, system failure caused by the misusage of a memory module can be prevented. In addition, since a flash memory for storing a system boot code is installed at the memory module storing the system S/W, the manufacturing cost and size of a mother board can be reduced.

While the present invention has been shown and described with reference to exemplary embodiments thereof, it will be understood by those of ordinary skill in the art that various changes in form and detail may be made herein without departing from the spirit and scope of the present invention, as defined by the following claims.

What is claimed is:

1. A non-volatile memory system comprising:
a first socket and a second socket each having at least one notch coupler;
a first memory module configured to comprise a plurality of non-volatile memory devices and to store system software;
a memory controller configured to control the first memory module; and
a printed circuit board on which the memory controller and the first and second sockets are installed and electrical signals lines are formed between the memory controller and the first and second sockets,
wherein the first memory module can be installed at the first socket but cannot be installed at the second socket, and
wherein the at least one notch coupler in the first socket is different from the at least one notch coupler in the second socket.

2. The non-volatile memory system of claim 1, further comprising a second memory module configured to comprise a plurality of non-volatile memory devices to extend a memory capacity of the memory system,
wherein the second memory module can be installed at the second socket but cannot be installed at the first socket.

3. The non-volatile memory system of claim 2, wherein at least one notch is formed in each of the first and second memory modules,
wherein the notch in the first memory module is different from the notch in the second memory module.

4. The non-volatile memory system of claim 3, further comprising:
a third memory module configured to comprise a plurality of non-volatile memory devices and at least one notch to extend a memory capacity of the memory system; and
a third socket configured to comprise at least one notch coupler to allow the third memory module to be installed,
wherein the second memory module and the third memory module have the same size and the same notch construction, and
wherein the second socket and the third socket have the same size and the same notch coupler construction.

5. The non-volatile memory system of claim 4, wherein the plurality of non-volatile memory devices included in each of the first through third memory modules are included in at least one memory bank, and
wherein the plurality of non-volatile memory devices included in the same memory bank are simultaneously selected in response to a corresponding bank selection signal from among a plurality of bank selection signals output from the memory controller.

6. The non-volatile memory system of claim 4, wherein the bank selection signals are respectively input from a least significant signal to a most significant signal to the first through third socket sequentially, and
wherein the first through third memory modules are sequentially and respectively installed at the first through third sockets.

7. The system of claim 6, wherein the system is a computer system and the printed circuit board is a mother board further comprising a main central processing unit for controlling the computer system.

8. The non-volatile memory system of claim 4, wherein at least one memory device from among the plurality of non-volatile memory devices comprised in the first memory module is used to store a system boot code, wherein the first memory module further comprises a plurality of pins, and wherein at least one pin from among the plurality of pins is exclusively used for an interface between the non-volatile memory device used to store the system boot code and the memory controller.

9. A non-volatile memory system comprising
a first socket and a second socket each having a notch coupler;
a first memory module configured to comprise a plurality of non-volatile memory devices and to store system software;
a memory controller configured to control the first memory module; and
a printed circuit board on which the memory controller and the first and second sockets are installed and electrical signals lines are formed between the memory controller and the first and second sockets,
wherein the first memory module can be installed at the first socket but cannot be installed at the second socket; and
an alarm unit configured to generate an alarm sound when the first memory module is removed from the first socket.

10. The non-volatile memory system of claim 9, wherein the first memory module further comprises a plurality of pins, and
wherein at least one pin from among the plurality of pins is electrically connected with the alarm unit when the first memory module is installed at the first socket.

11. The non-volatile memory system of claim 10, wherein the alarm unit generates an alarm sound when the first memory module is removed from the first socket.

12. The non-volatile memory system of claim 10, wherein the alarm unit comprises:
a buzzer configured to generate the alarm sound in response to an enable signal; and
a battery module configured to supply power to the buzzer and to output the enable signal for enabling or disabling the buzzer based on a current signal or a voltage signal of at least one pin from among the plurality of pins.

13. The non-volatile memory system of claim 9, wherein the plurality of non-volatile memory devices included in the first and second memory modules comprise NAND flash memory devices.

14. A system including a non-volatile memory system, comprising:
a first socket and a second socket each having a notch coupler;
a first memory module configured to comprise a plurality of non-volatile memory devices and to store system software;
a memory controller configured to control the first memory module;
a printed circuit board on which the memory controller and the first and second sockets are installed and electrical signals lines are formed between the memory controller and the first and second sockets,
wherein the first memory module can be installed at the first socket but cannot be installed at the second socket; and
wherein the notch coupler in the first socket is different from the notch coupler in the second socket.

15. The system of claim 14, further comprising;
an alarm unit configured to generate an alarm sound when the first memory module is removed from the first socket.

16. A non-volatile memory module for system software, comprising:
a memory module substrate in which at least one notch and a plurality of input/output pins are formed;
a first non-volatile memory device installed on at least one side of the memory module substrate to store a system boot code;
a second non-volatile memory device storing the system software,
wherein the non-volatile memory module can be installed at a socket comprising a notch coupler that can be engaged with the at least one notch but cannot be installed at a socket used for a non-volatile memory module for a memory capacity extension, which comprises a notch different from the at least one notch; and
an alarm unit configured to generate an alarm sound when the non-volatile memory module is removed from the socket comprising the notch coupler.

17. The non-volatile memory module of claim 16, wherein a capacity of the first non-volatile memory device is less than a capacity of the second non volatile memory device.

* * * * *